United States Patent
Yamanaka et al.

(10) Patent No.: US 8,253,027 B2
(45) Date of Patent: Aug. 28, 2012

(54) CIRCUIT BOARD AND STRUCTURE USING THE SAME

(75) Inventors: Kimihiro Yamanaka, Yasu (JP); Manabu Ichinose, Yasu (JP); Satoshi Nakamura, Yasu (JP)

(73) Assignee: Kyocera Corporation, Kyoto (JP)

( * ) Notice: Subject to any disclaimer, the term of this patent is extended or adjusted under 35 U.S.C. 154(b) by 224 days.

(21) Appl. No.: 12/712,034

(22) Filed: Feb. 24, 2010

(65) Prior Publication Data
US 2010/0212947 A1 Aug. 26, 2010

(30) Foreign Application Priority Data
Feb. 25, 2009 (JP) .................................. 2009-042841

(51) Int. Cl.
*H05K 1/03* (2006.01)
(52) U.S. Cl. ........ 174/255; 174/260; 174/262; 174/264; 174/265; 174/266; 174/366; 257/736; 257/750; 257/774; 428/209; 29/846
(58) Field of Classification Search .................. 174/255, 174/260, 262, 264, 265, 266, 366; 257/736, 257/750, 774; 428/209; 29/846
See application file for complete search history.

(56) References Cited

U.S. PATENT DOCUMENTS

| | | | | |
|---|---|---|---|---|
| 6,010,769 A | * | 1/2000 | Sasaoka et al. | 428/209 |
| 6,713,685 B1 | * | 3/2004 | Cotton | 174/262 |
| 7,378,601 B2 | * | 5/2008 | Hsu et al. | 174/262 |
| 2004/0112617 A1 | * | 6/2004 | Cotton | 174/35 R |
| 2005/0247482 A1 | * | 11/2005 | Nakamura | 174/262 |
| 2006/0118329 A1 | * | 6/2006 | Nakamura | 174/260 |
| 2008/0093117 A1 | * | 4/2008 | Oikawa et al. | 174/262 |
| 2010/0193231 A1 | * | 8/2010 | Yamanaka et al. | 174/260 |
| 2010/0314778 A1 | * | 12/2010 | Murai et al. | 257/774 |

FOREIGN PATENT DOCUMENTS
JP 08-116174 5/1996
* cited by examiner

*Primary Examiner* — Xiaoliang Chen
(74) *Attorney, Agent, or Firm* — DLA Piper LLP (US)

(57) ABSTRACT

According to one embodiment of the invention, a circuit board comprises a conductive layer including a land portion and a line portion connected to the land portion, and; a conductor connected to a surface of the land portion. A planar shape of the connected portion between the conductor and the land portion has a elongated shape along a width direction of the line portion. A part of the connected portion is located within an imaginary region formed by imaginarily extending the line portion toward the land portion.

9 Claims, 9 Drawing Sheets

CIRCUIT BOARD AND STRUCTURE USING THE SAME

CROSS REFERENCE TO RELATED APPLICATION(S)

The present application claims priority under 35 U.S.C. §119 to Japanese Patent Application No. 2009-42841, filed on Feb. 25, 2009, entitled "CIRCUIT BOARD AND MOUNTING STRUCTURE USING THE SAME", the entirety of which is incorporated by reference herein.

BACKGROUND OF THE INVENTION

1. Field of the Invention

The present invention relates to a circuit board and a structure used for electronic devices (e.g., audiovisual devices, electrical appliances, communication devices, computer devices, and the peripheral devices thereof).

2. Description of the Related Art

A structure obtained by mounting or embedding an electronic component on or in a circuit board has been used in electronic devices.

Figure 9:
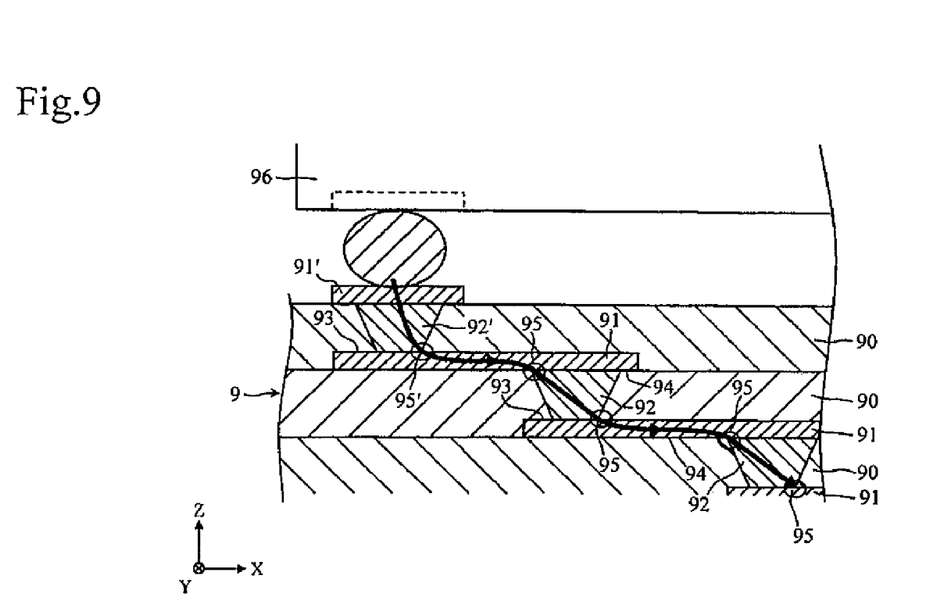
FIG. 9 is a sectional view showing a principal part in an example of a conventional structure.

As shown in FIG. 9, a circuit board 9 includes a plurality of conductive layers 91 apart from each other in the thickness direction, insulating layers 90 interposed therebetween, and a plurality of via conductors 92 electrically connecting the conductive layers 91. The via conductors 92 are formed in the insulating layers 90 to be apart from each other in a plan view. In the circuit board 9, the conductive layers 91 and the via conductors 92 constitute a power supply line and a signal line (refer to Japanese Unexamined Patent Application Publication No. 8-116174).

Focusing on a single conductive layer 91 (other than a conductive layer 91' that is located in an outer layer), each of the via conductors 92 is connected to an upper surface 93 and a lower surface 94 of the conductive layer 91. For example, a current flows in the order of the via conductor 92 (thickness direction), the conductive layer 91 (plane direction), and the via conductor 92 (thickness direction) as indicated by an arrow in the drawing. Since a current flows through a path having the shortest distance in a conductive region, the current is concentrated in a portion 95 (a portion circled in the drawing) in the connected portion between the via conductor 92 and the conductive layer 91, which causes unbalanced current density. Therefore, in the portion 95, metal atoms contained in the via conductor 92 may migrate due to a collision between electrons and metal atoms. This phenomenon is called electromigration. Electromigration decreases the metal density in the portion 95 (portion in which a current is concentrated) of the connected portion between the via conductor 92 and the conductive layer 91. Consequently, cracking occurs in the connected portion between the via conductor 92 and the conductive layer 91, which sometimes decreases the reliability of the circuit board 9.

Electromigration mainly occurs in a power supply line, but it is highly likely to occur in a signal line too if the size of a signal line becomes smaller in the future.

Focusing on a conductive layer 91' that is located in an outer layer, a single via conductor 92' is connected to the conductive layer 91'. Even in this case, electromigration occurs in a portion 95' of the connected portion between the conductive layer 91 and the via conductor 92', which sometimes decreases the connection reliability of an electronic component 96 to the circuit board 9.

BRIEF SUMMARY OF THE INVENTION

An object of the invention is to provide a circuit board and a structure which improve a connection reliability.

A circuit board according to one of the invention comprises a conductive layer including a land portion and a line portion connected to the land portion, and a conductor connected to a surface of the land portion. A planar shape of the connected portion between the conductor and the land portion has an elongated shape along a width direction of the line portion. A part of the connected portion is in an imaginary region formed by imaginarily extending the line portion toward the land portion.

A structure according to one of the invention comprises the circuit board and an electronic component electrically connected to the conductive layer and the conductor in the circuit board.

The circuit board and the structure can improve a reliability of the connected portion between the conductor and the land portion by dispersing a current flowing through the connected portion between the conductor and the land portion.

DETAILED DESCRIPTION OF EXEMPLARY EMBODIMENTS

A circuit board and a structure according to an embodiment of the present invention are described in detail with reference to the attached drawings.

Figure 1:
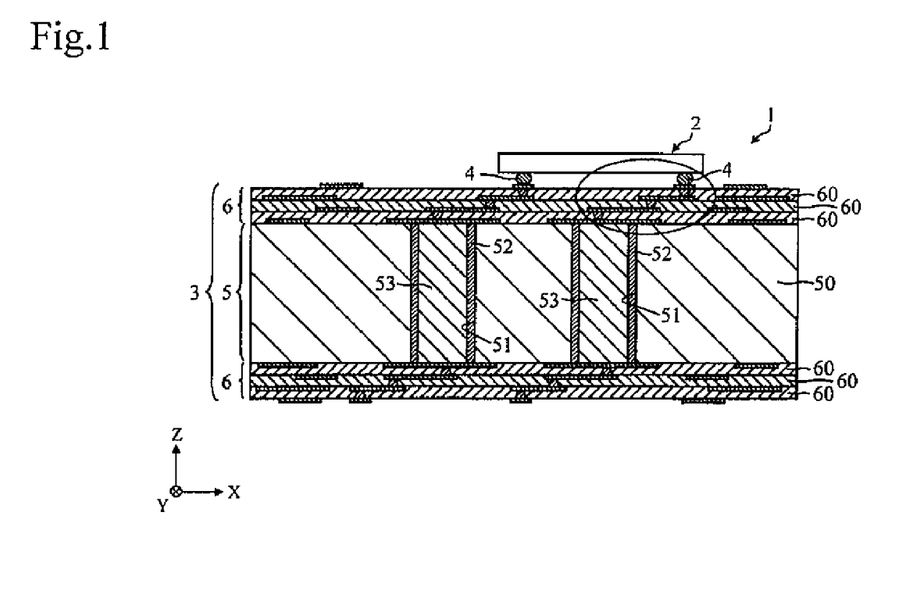
FIG. 1 is a sectional view of a structure according to an embodiment of the present invention.

A structure 1 shown in FIG. 1 is used for electronic devices such as audiovisual devices, electrical appliances, communication devices, computer devices, and the peripheral devices thereof. The structure 1 includes an electronic component 2 and a circuit board 3.

The electronic component 2 is a semiconductor device such as an integrated circuit (IC) or a large-scale integrated circuit (LSI), and is mounted on the circuit board 3 through conductive bumps 4 such as solder using a flip chip packaging technology. The electronic component 2 has a base composed of a semiconductor material such as silicon, germanium, gallium arsenide, gallium arsenide phosphide, gallium nitride, or silicon carbide. The electronic component 2, for example, having a thickness of 0.1 mm or more and 1 mm or less may be used.

The circuit board 3 includes a core substrate 5 and a pair of circuit layers 6 on an upper surface and a lower surface of the core substrate 5.

The core substrate 5 electrically connects the pair of circuit layers 6 to each other while maintains the strength of the circuit board 3. The thickness of the core substrate 5 is 0.3 mm or more and 1.5 mm or less. The core substrate 5 includes insulating bases 50, through-holes 51 formed in the insulating bases 50 to penetrate the insulating bases 50, through-hole conductors 52 formed in the through-holes 51, and insulating bodies 53 formed in the through-hole conductors 52.

Each of the insulating bases 50 is a principal part of the core substrate 5. The insulating base 50 can be manufactured, for example, by stacking a plurality of sheets obtained by impregnating a reinforced material with a thermosetting resin and then by curing the thermosetting resin through thermal pressing or the like.

A material composed of, for example, plain-woven glass fiber or resin fiber may be used as the reinforced material. The resin fiber can be formed of a polyparaphenylene benzobisoxazole resin or a wholly aromatic polyamide resin.

Examples of the thermosetting resin include epoxy resins, bismaleimide triazine resins, and cyanate resins.

The insulating base 50 can also be manufactured from a low thermal expansion resin without using the reinforced material. In this case, the insulating base 50 may be manufactured from only a low thermal expansion resin or may be manufactured by stacking a plurality of sheets composed of a low thermal expansion resin through adhesive resins.

Examples of the low thermal expansion resin for the insulating base 50 include polyparaphenylene benzobisoxazole resins, wholly aromatic polyamide resins, wholly aromatic polyester resins, polyimide resins, liquid crystal polymer resins and/or a combination thereof. Among them, a polyparaphenylene benzobisoxazole resin is preferably used. The coefficient of thermal expansion of the polyparaphenylene benzobisoxazole resin is as low as $-5$ ppm/° C. or more and 5 ppm/° C. or less. With such a low thermal expansion resin, the thermal expansion of the core substrate 5 itself can be suppressed. The coefficient of thermal expansion is in conformity with ISO 11359-2:1999.

Each of the through-holes 51 is a portion where each of the through-hole conductors 52 is formed and penetrates the core substrate 5 in the thickness direction (Z axis direction). The through-hole 51 has a cylindrical shape having a diameter of, for example, 0.1 mm or more and 1 mm or less. Such a through-hole 51 can be formed by well-known drilling.

The through-hole conductor 52 electrically connects the pair of circuit layers 6 to each other, and is formed along an inner surface of the through-hole 51. The through-hole conductor 52 is composed of a conductive material such as copper, silver, gold, aluminum, nickel, chromium and/or a combination thereof. The through-hole conductor 52 can be formed by performing electrolytic plating or the like on the inner surface of the through-hole 51.

Each of the insulating bodies 53 fills the remaining space surrounded by the through-hole conductors 52. The insulating body 53 can be formed by filling the remaining space with a resin material and then by curing the resin material. Examples of the resin material for the insulating body 53 include polyimide resins, acrylic resins, epoxy resins, cyanate resins, fluorocarbon resins, silicon resins, polyphenylene ether resins, bismaleimide triazine resins and/or a combination thereof. By forming the insulating body 53 in the core substrate 5, the via conductors 8 described later can be formed immediately on and under the insulating body 53. Therefore, the length of a conductive line routed from the through-hole conductor 52 can be shortened, which can achieve the miniaturization of the circuit board 3.

The pair of circuit layers 6 are stacked on both surfaces of the core substrate 5 and include a plurality of insulating layers 60, a plurality of conductive layers 7 on the insulating layers 60, and a plurality of via conductors 8 penetrating the insulating layer 60 and electrically connecting the conductive layers 7 to each other. The conductive layers 7 and the via conductors 8 are electrically connected to each other to constitute a circuit member. The circuit member includes a power supply line and a signal line.

Each of the insulating layers 60 is configured to ensure the insulation of a portion other than the circuit member and has a through-hole 61. The through-hole 61 is a portion where each of the via conductors 8 is formed. The through-hole 61 can be formed by perpendicularly irradiating the insulating layer 60 with laser beams using, for example, an yttrium-aluminum-garnet (YAG) laser device, a CO2 laser device, or an excimer laser device. The output energy of the laser beams is set to be, for example, $1.0 \times 10\text{-}3$ J or higher and $5.0 \times 10\text{-}1$ J or lower. The irradiation time of the laser beams is set to, for example, $1.0 \times 10\text{-}3$ sec or longer and 1.0 sec or shorter. By such a method, the laser beams are perpendicularly applied from the upper surface of the insulating layer 60 and the through-hole 61 whose lower portion is narrower in width than the upper portion can be formed.

After the through-hole 61 is formed, desmearing may be performed to remove the residues that adhere to the inner surface of the through-hole 61. The desmearing can be performed by plasma treatment or etching treatment. The plasma treatment can be performed, for example, by processing the inner surface using a microwave in an argon gas or oxygen gas atmosphere. The etching treatment can be performed by wet etching with an etching solution. A permanganic acid aqueous solution obtained by, for example, adding 20 g or more and 40 g or less of permanganic acid and 35 g or more and 45 g or less of sodium hydroxide to a liter of distilled water can be used as the etching solution. The etching solution is preferably used after warming, that is, at 30° C. or more and 40° C. or less. In that case, the etching time is set to, for example, 2 minutes or longer and 4 minutes or shorter.

The insulating layer 60 is preferably formed of a material whose coefficient of thermal expansion is close to that of the electronic component 2. The thickness of the insulating layer 60 after drying is, for example, 1 μm or more and 15 μm or less. The insulating layer 60 is formed of, for example, a thermosetting resin or a thermoplastic resin. The coefficient of thermal expansion of the insulating layer 60 is set to, for example, 15 ppm/° C. or more and 80 ppm/° C. or less.

Examples of the thermosetting resin for the insulating layer 60 include polyimide resins, acrylic resins, epoxy resins, urethane resins, cyanate resins, silicon resins, bismaleimide triazine resins, and/or a combination thereof.

The thermoplastic resin for the insulating layer 60 needs to have thermal resistance so as to endure heat treatment during reflow soldering, in addition to a coefficient of thermal expansion close to that of the electronic component 2. Therefore, the thermoplastic resin for the insulating layer 60 preferably has a softening temperature of 200° C. or higher. Examples of the thermoplastic resin include polyether ketone resins, polyethylene terephthalate resins, polyphenylene ether resins, and/or a combination thereof.

The insulating layer 60 may include a filler having a plurality of particles. Since the viscosity of the insulating layer 60 before curing can be adjusted by providing a filler in the insulating layer 60, the dimensional accuracy of the thickness of the insulating layer 60 can be improved. The particles having a spherical shape whose diameter is, for example, 0.05 μm or more and 6 μm or less can be used as the filler. The particles of the filler is composed of a material having a coefficient of thermal expansion of $-5$ ppm/° C. or more and 5 ppm/° C. or less. Examples of the material include silicon oxide (silica), silicon carbide, aluminum oxide, aluminum nitride, aluminum hydroxide and/or a combination thereof.

Figure 2:
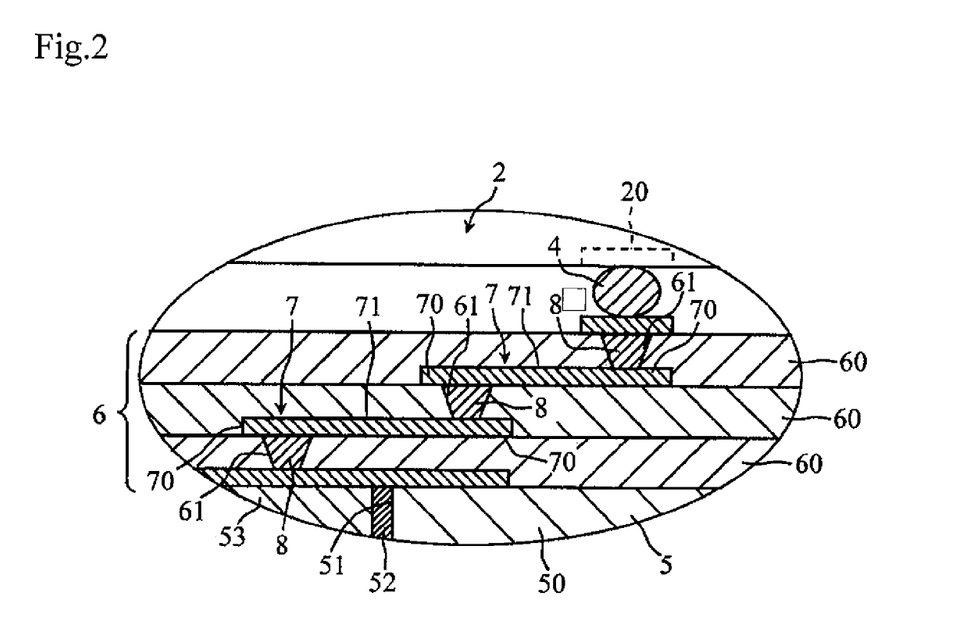
FIG. 2 is an enlarged sectional view of a principal part (a region circled in a solid line) of the structure shown in FIG. 1.

The plurality of conductive layers 7 constitute the circuit member together with the via conductors 8. As shown in FIG. 2, the plurality of conductive layers 7 are apart form each other in the thickness direction. Each of the conductive layers 7 is composed of a metallic material such as copper, silver, gold, aluminum, nickel, chromium, and/or a combination thereof, and includes land portions 70 and a line portion 71.

Figure 3:
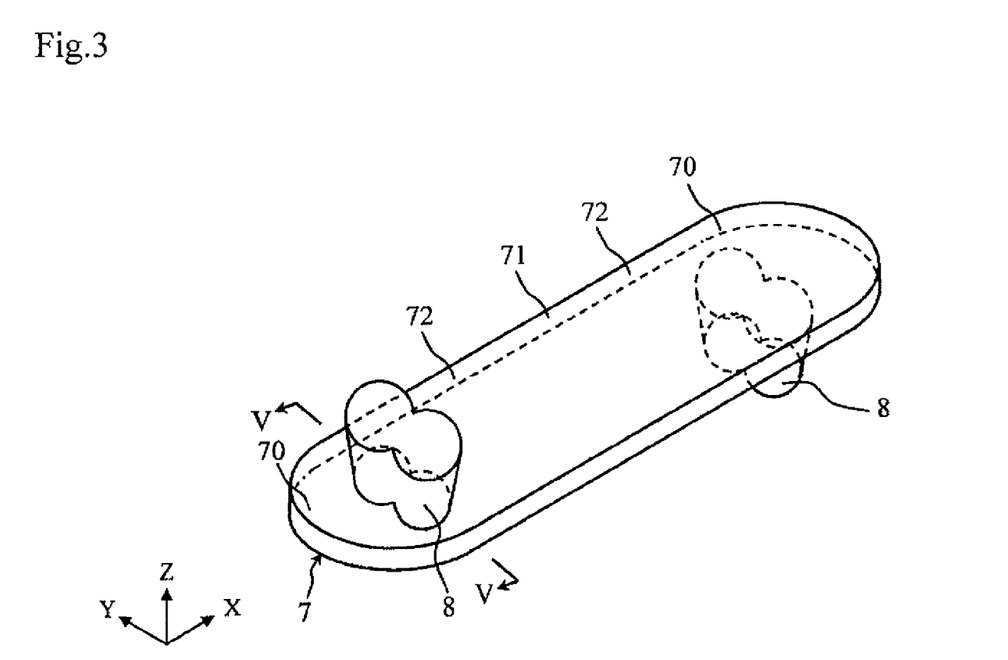
FIG. 3 is a partial perspective view showing via conductors and a conductive layer.
Figure 4:
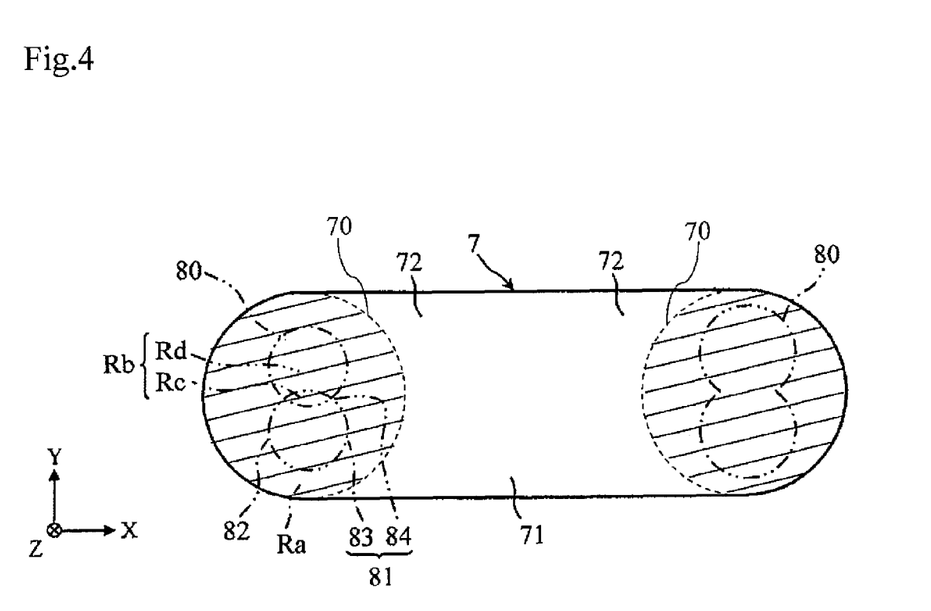
FIG. 4 is a plan view of the conductive layer.

As shown in FIGS. 2 and 3, the land portions 70 are arranged apart from each other in a plan view and each of the land portions 70 is connected to a via conductor 8. As shown in FIG. 4, the planar shape of the land portion 70 is larger than that of the via conductor 8. Therefore, when the via conductors 8 are formed, the alignment precision between the land portion 70 and each of the via conductors 8 can be increased and the connection reliability between the conductive layers 7 and the via conductors 8 can be improved.

As shown in FIGS. 3 and 4, the line portion 71 includes a linear portion 72 connected to the land portion 70 and connects two land portions 70 to each other.

Such a conductive layer 7 is formed into a desired shape by forming a conductive film using a well-known film formation method and then by patterning the conductive film. Examples of the film formation method include vapor deposition, chemical vapor deposition (CVD), sputtering, and/or a combination thereof. The patterning can be performed by, for example, photolithography.

The conductive layer 7 is connected to the via conductors 8. As shown in FIG. 2, the via conductor 8 connects the conductive layers 7 apart from each other in the thickness direction. The via conductor 8 functions as an external connection terminal electrically connected to the electronic component 2 such as an IC via a pad 20 and a bump 4. These via conductors 8 is composed of a conductive material such as copper, silver, gold, aluminum, nickel, chromium, and/or a combination thereof.

Referring to FIG. 3, the via conductors 8 has a shape that two columns are arranged in a width direction (Y direction) of the linear portion 72 to partially overlap with each other, and the lower surface of the via conductor 8 has a smaller area than the upper surface thereof. The lower surface or the upper surface of the via conductor 8 is connected to the land portion 70, and a connected portion 80 is formed between the via conductor 8 and the land portion 70.

As shown in FIG. 4, the planar shape of the connected portion 80 is a shape in which two circles are arranged in the width direction (Y direction) of the linear portion 72 so as to partially overlap with each other. The shape is an elongated shape having a longitudinal direction along the width direction (Y direction) of the linear portion 72, and at least part of the planar shape is located in an imaginary region Ra formed by imaginarily extending the linear portion 72 toward the land portion 70. The imaginary region Ra is shown as a hatched portion. Because the planar shape of the connected portion 80 is a shape elongated in the width direction (Y direction) in such a manner, a current flowing through the linear portion 72, the imaginary region Ra, and the via conductor 8 is dispersed in the longitudinal direction of the connected portion 80 between the land portion 70 and the via conductor 8, which can reduce the generation of electromigration. As a result, since cracking in the connected portion 80 can be less likely to occur, the connection reliability between the conductive layer 7 and the via conductor 8 can be improved. When the planar shape of the connected portion 80 is formed such that the length of the imaginary region Ra in the extending direction (X direction) is smaller than that in the width direction, the conductive layer 7 can be downsized in the extending direction. Consequently, the circuit pattern can be miniaturized in the circuit board 3.

The planer shape of the connected portion 80 has a pair of first long sides 81 and 82 that extend in the width direction of the linear portion 72. The first long side 81 closer to the linear portion 72 includes a plurality of convex portions 83 projecting toward the linear portion 72. In this structure, since a current is dispersed to each of the convex portions 83, the current in the connected portion 80 can be further dispersed. Herein, a concave portion 84 is formed between the two adjacent convex portions 83.

In the planar shape of the connected portion 80, the concave portion 84 is located closer to the center of the imaginary region Ra than the convex portions 83. In this structure, since the convex portions 83 are formed in a region other than the center where a current is easily concentrated in the related art, the current in the connected portion 80 can be further dispersed.

Figure 5:
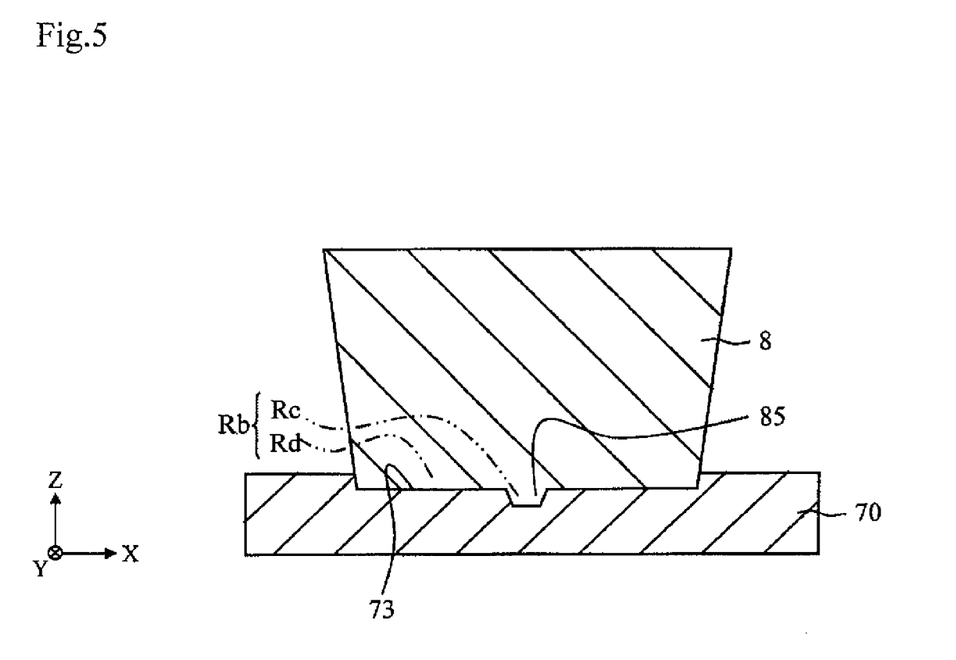
FIG. 5 is a sectional view taken along line V-V of FIG. 3.

As shown in FIGS. 4 and 5, the land portion 70 has a cavity portion 73 in a first region Rb corresponding to the connected portion 80. The cavity portion 73 includes a second region Rc corresponding to the concave portion 84 and a third region Rd that is a region other than the second region Rc. The second region Rc is deeper than the third region Rd. Meanwhile, a part of the via conductor 8 is disposed in the cavity portion 73.

Therefore, the part of the via conductor 8 projects toward the land portion 70 in the second region Rc corresponding to the concave portion 84, whereby the adhesion between the land portion 70 and the via conductor 8 can be increased and the connection reliability between the conductive layer 7 and the via conductor 8 can be further improved.

The depth of the second region Rc corresponding to the concave portion 84 is preferably set to be 1.5 times or more and 2 times or less the depth of the third region Rd.

The via conductor 8 can be formed by applying laser beams to an insulating layer 60 in two areas that partially overlap with each other in the width direction of the linear portion 72 using, for example, a YAG laser device or a CO2 laser device to form a through-hole 61 in which the land portion 70 is exposed and then by coating the through-hole 61 with a plating film by electroless plating or the like. When the through-hole 61 is formed, the cavity portion 73 is formed in the land portion 70 due to the irradiation with the laser beams. Furthermore, since the two areas are irradiated with the laser beams so as to partially overlap with each other, the second region Rc that is an overlap region is formed more deeply than the third region Rd. In addition, because the second region Rc is irradiated with the laser beams for a longer time than the third region Rd, the residue of a resin derived from the insulating layer 60 is appropriately removed. As a result, a plating film can coat the second region Rc where the residue of a resin is hardly left, the adhesion between the land portion 70 and the via conductor 8 can be improved.

The whole area of the planar shape of the connected portion 80 is located in the imaginary region Ra. In this structure, a current in the connected portion 80 can be further dispersed over the entire connected portion 80 in the longitudinal direction.

Both ends of the imaginary region Ra in the width direction touch both ends of the land portion 70. In this structure, a current in the connected portion 80 can be further dispersed over the entire connected portion 80 in the longitudinal direction without increasing the width of the conductive layer 7.

In a planar shape of the connected portion 80, the length in the transverse direction (X direction) is preferably set to be 20% or more and 50% or less of the length in the longitudinal direction (Y direction).

The present invention is not limited to the above-described embodiments, and various changes and modifications can be made without departing from the spirit and scope of the present invention.

For example, the planar shape of the land portion is not limited to a circular shape and may be any shape. For example, the planar shape of the land portion may be a shape similar to the planar shape of the connected portion between the via conductor and the land portion.

In the cavity portion of the land portion, the second region may have almost the same depth as the third region other than the second region.

The planar shape of the connected portion between the via conductor and the land portion is not limited to a shape in which two circles are arranged in the width direction of the linear portion so as to partially overlap with each other, and may be any shape such as the shapes shown in FIGS. 6A to 6D.

The line portion may further include a curve portion other than the linear portion as long as the linear portion is directly connected to the land portion.

Figure 6A:
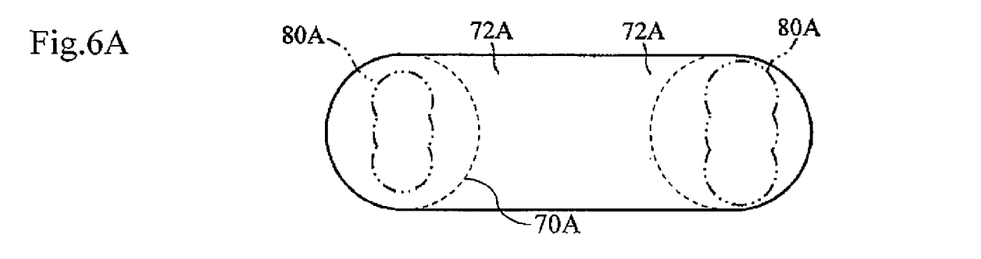
FIGS. 6A to 6E are plan views showing other examples of the conductive layer.
Figure 6B:
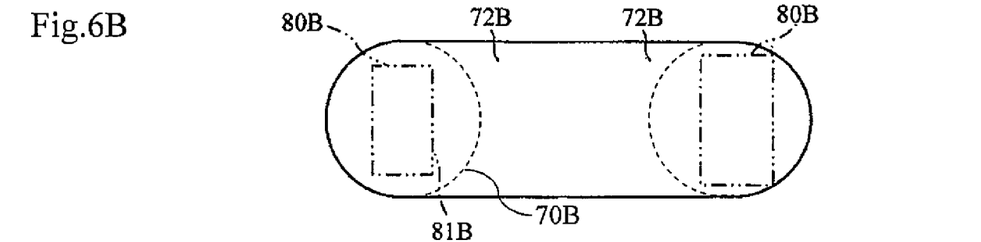
Figure 6C:
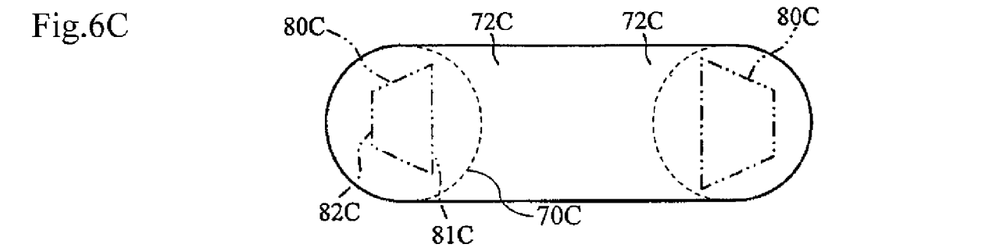
Figure 6D:
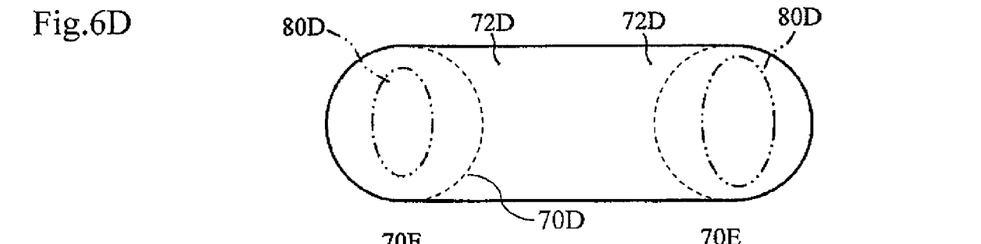
Figure 6E:
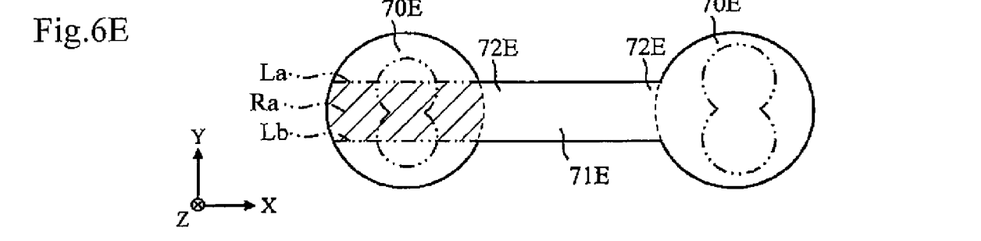

The width of the line portion is not necessarily equal to that of the land portion, and may be smaller than that of the land portion like the configuration shown in FIG. 6E.

The configurations shown in FIGS. 6A to 6E are described.

The connected portions 80A, 80B, 80C, and 80D respectively shown in FIGS. 6A to 6D are different from the connected portion 80 in the circuit board 3 described above in terms of planar shape (refer to FIGS. 1 to 5).

The planar shape of the connected portion 80A shown in FIG. 6A is a shape in which three circles are arranged in the width direction of the linear portion 72A so as to partially overlap with each other. In such a connected portion 80A, the length in the longitudinal direction can be easily increased. As a result, a current in the connected portion 80A can be further dispersed. The connected portion 80A having such a shape can be formed by applying laser beams to an insulating layer in three areas that partially overlap with each other and extend in the width direction of the linear portion 72A using, for example, a YAG laser device or a CO2 laser device to form a through-hole and then by coating the through-hole with a plating film.

The planar shape of the connected portion 80B shown in FIG. 6B is a rectangular shape whose long sides extend in the width direction of a linear portion 72B. In such a connected portion 80B, a first long side 81B closer to the linear portion 72B is a straight line that is parallel to the longitudinal direction. As a result, a current can be dispersed more uniformly on the first long side 81B, whereby the current in the connected portion 80B can be further dispersed. The corners of the rectangular shape are preferably rounded off. Consequently, the concentration of thermal stress at the corners can be dispersed, which can further improve the connection reliability between the conductive layer and the via conductor.

The planar shape of the connected portion 80C shown in FIG. 6C is a quadrilateral shape having a first long side 81C and a second long side 82C that each extend in the width direction of a linear portion 72C. The first long side 81C closer to the linear portion 72C is longer than the second long side 82C further from the linear portion 72C. In such a connected portion 80C, a current can be further dispersed on the first long side 81C while a region on the side of the long side 85C side of the land portion 70C is formed so as to have a small area. Preferably, the corners of the quadrilateral shape are rounded off and have a radius of curvature of 2 μm or more and 10 μm or less.

The planar shape of the connected portion 80D shown in FIG. 6D is an elliptical shape with a major axis that extends in the width direction of a linear portion 72D.

The connected portions 80B, 80C, and 80D respectively shown in FIGS. 6B, 6C, and 6D can be formed by forming a through-hole with a desired shape in an insulating layer using, for example, an excimer laser device and then by coating the through-hole with a plating film. With a YAG laser device or a CO2 laser device, the connected portion 80D shown in FIG. 6D can be easily formed by applying laser beams whose shape is adjusted to an elliptical shape using an aperture.

The line portion 71E shown in FIG. 6E is different from the line portion 71 (refer to FIGS. 1 to 5) in the circuit board 3 described above. The line portion 71E has a shape whose width is smaller than that of a land portion 70E. In such a line portion 71E, the circuit pattern can be miniaturized. The imaginary region Ra shown as a hatched portion in FIG. 6E is a region surrounded by imaginary lines La and Lb that are parallel to the longitudinal direction of the linear portion 72E and extend from the side portions of the linear portion 72E.

Example

In this Example, a correlation between the planar shape of a connected portion and the current density in the connected portion was investigated.

The current densities for connected portions 80A', 80B', 80C', and 80D' respectively shown in FIGS. 7A to 7D were calculated through simulation.

Figure 7A:
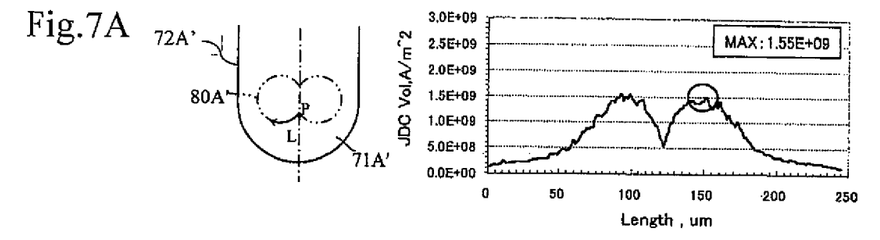
FIGS. 7A to 7D are plan views for each describing a connected portion between a conductive layer and a via conductor for which current density is calculated, and are graphs showing the simulation results of the current densities.

A planar shape of a connected portion 80A' between a land portion 70A' and a via conductor is a shape in which two circles are arranged in the width direction of a linear portion 72A' so as to partially overlap with each other. In the planar shape of the connected portion 80A', the length in the width direction of the linear portion 72A' is 88 μm and the diameter of the circles is 48 μm. The diameter of the land portion 70A' and the width of the linear portion 72A' are each 120 μm.

Figure 7B:
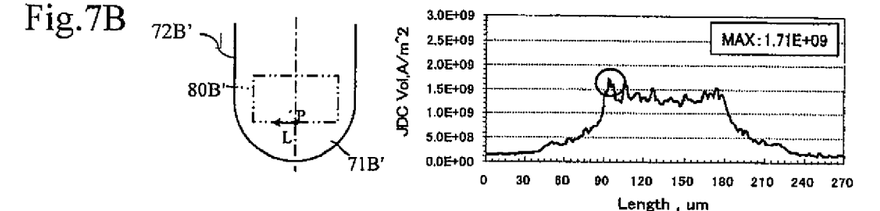

A planar shape of a connected portion 80B' between a land portion 70B' and the via conductor is a rectangular shape having a long side 81B' that extends in the width direction of a linear portion 72B'. In the planar shape of the connected portion 80B', the long sides 81B' has a length of 88 μm and the short side has a length of 48 μm. The sizes of the land portion 70B' and the linear portion 72B' are the same as the sizes of the land portion 70A' and the linear portion 72A' shown in FIG. 7A.

Figure 7C:
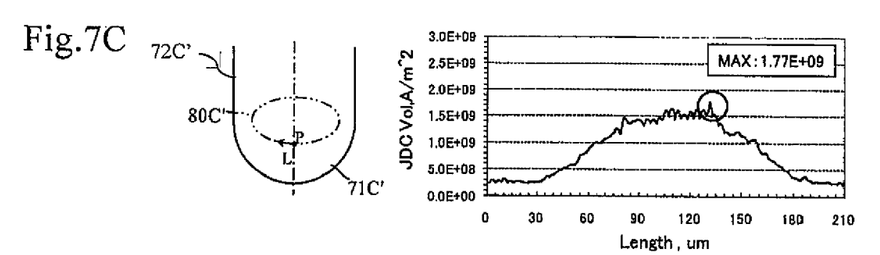

A planar shape of the connected portion 80C' between a land portion 70C' and a via conductor is an elliptical shape having a major axis that extends in the width direction of a linear portion 72C'. In the planar shape of the connected portion 80C', the major axis has a length of 88 μm and the minor axis has a length of 48 μm. The sizes of the land portion 70C' and the linear portion 72C' are the same as the sizes of the land portion 70A' and the linear portion 72A' shown in FIG. 7A.

Figure 7D:
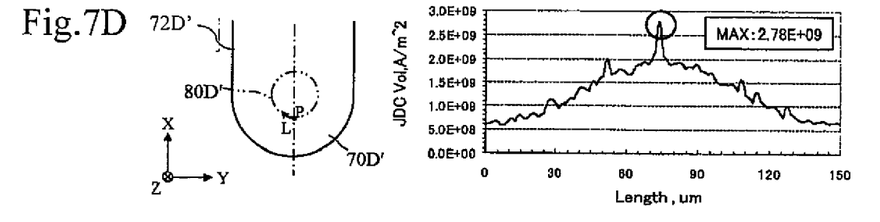

A planar shape of a connected portion 80D' between a land portion 70D' and a via conductor is a circular shape. In the planar shape of the connected portion 80D', the diameter of the circle is 48 μm. The sizes of the land portion 70D' and the linear portion 72D' are the same as the sizes of the land portion 70A' and the linear portion 72A' shown in FIG. 7A. This via conductor corresponds to a conventional via conductor.

Figure 8:
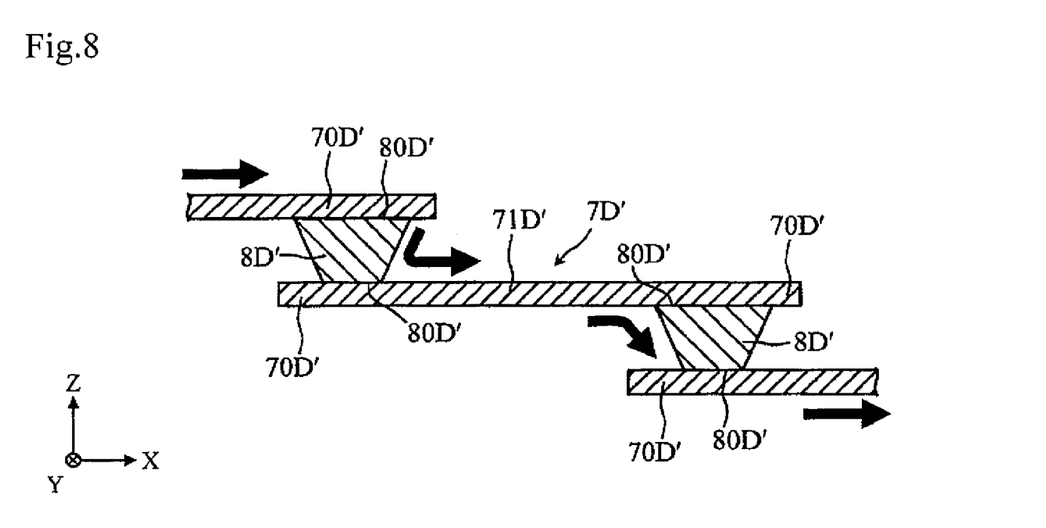
FIG. 8 is a sectional view of an example shown in FIG. 7D for describing the path of a current flowing in a simulation.

Assuming that 1 ampere of direct current flows from a land portion 70D' to another land portion 70D' as shown in FIG. 8, the current density along the rim of a planar shape of the connected portion 80D' between the via conductor and the land portion 70D' of the conductive layer was calculated. The current densities along the rims of the connected portions 80A', 80B', and 80C' were also calculated in the same manner as that of the connected portion 80D'. The current densities were calculated using commercially available software "Ansoft Q3D Extractor". FIGS. 7A to 7D show the results. In each of the drawings, the abscissa indicates the length L along the rim of the connected portion 80A', 80B', 80C', or 80D' from a reference point P and the ordinate indicates the result of the calculated current density.

In the connected portion 80A', 80B' and 80C' shown in FIGS. 7A to 7C, a portion having high current density extends over a relatively wide area. In contrast, in the connected portion 80D' having the conventional shape shown in FIG. 7D, a current becomes concentrated in a portion opposite the reference point P.

The maximum current densities calculated for the connected portion 80A', 80B', and 80C shown in FIGS. 7A to 7C were smaller than that calculated for the connected portion 80D' shown in FIG. 7D.

Accordingly, in a case that the planar shape of a connected portion has a long shape along the width direction of a linear portion, the concentration of a current in the connected portion between the land portion and the via conductor can be reduced.

As shown in FIG. 7A, in the connected portion 80A', a region having a high current density was separated into two portions. Thus, the maximum current density calculated for the connected portion 80A' shown in FIG. 7A was even smaller than that calculated for the connected portion 800' shown in FIG. 7C.

This is because a current in the connected portion 80A' can be dispersed to each of the convex portions 83A' because of convex portion 83A' formed in the connected portion 80A'.

As shown in FIG. 7B, in the connected portion 80B', a current in a region having a high current density was dispersed over a certain range. Thus, the maximum current density calculated for the connected portion 80B' shown in FIG. 7B was even smaller than that calculated for the connected portion 8C' shown in FIG. 7C.

This is because a current in the connected portion 80B' can be uniformly dispersed through the first long side 81B' due to a long side 81B' parallel to the longitudinal direction of the planar shape of the connected portion 80B'.

Although the present invention has been fully described in connection with embodiments thereof with reference to the accompanying drawings, it is to be noted that various changes and modifications will become apparent to those skilled in the art. Such changes and modifications are to be understood as being included within the scope of the present invention as defined by the appended claims.

Terms and phrases used in this document, and variations thereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard, technologies that may be available or known now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

What is claimed is:

1. A circuit board comprising:
  a conductive layer including a land portion, and a line portion connected to the land portion, and;
  a conductor connected to a surface of the land portion;
  wherein, in a planar view, a shape of the connected portion between the conductor and the land portion is an elongated shape along a width direction of the line portion, and at least a part of the connected portion is located within an imaginary region formed by imaginarily extending the line portion toward the land portion.

2. The circuit board according to claim 1, wherein the shape of the connected portion has a first long side and a second long side along the width direction of the line portion, wherein the second long side is closer to the line-portion than the first long side is, and
  the second long side includes convex portions projecting toward the line portion.

3. The circuit board according to claim 2, wherein the second long side further includes a concave portion between the adjacent convex portions.

4. The circuit board according to claim 3, wherein the concave portion is located closer to a center of the imaginary region than the adjacent convex portions are.

5. The circuit board according to claim 3, wherein
  the land portion has a cavity portion in which a part of the conductors is filled, and the cavity has a first region corresponding to the concave portion, and
  a second region other than the first region, the first region of the cavity is deeper than the second region thereof.

6. The circuit board according to claim 1, wherein
  a whole area of the shape of the connected portion is located within the imaginary region.

7. A structure comprising:
  the circuit board according to claim 1; and
  an electronic component electrically connected to the conductive layer and the conductor in the circuit board.

8. The circuit board according to claim 1, wherein in the planar view, the shape of the connected portion has a shape in which a plurality of circles are arranged in the width direction of the linear portion so as to partially overlap with each other.

9. The circuit board according to claim 1, wherein in the planar view, the shape of the connected portion has an elliptical shape with a major axis that extends in the width direction of the linear portion.

* * * * *